(12) United States Patent
Zhang et al.

(10) Patent No.: US 10,212,010 B2
(45) Date of Patent: Feb. 19, 2019

(54) UNEQUALLY SPACED PULSE AMPLITUDE MODULATION SCHEME

(71) Applicant: ZTE Corporation, Shenzhen (CN)

(72) Inventors: Junwen Zhang, Randolph, NJ (US); Jianjun Yu, Basking Ridge, NJ (US); Yi Cai, Morristown, NJ (US); Jianyang Shi, Morristown, NJ (US)

(73) Assignee: ZTE Corporation, Shenzhen (CN)

( * ) Notice: Subject to any disclaimer, the term of this patent is extended or adjusted under 35 U.S.C. 154(b) by 0 days.

(21) Appl. No.: 15/649,433

(22) Filed: Jul. 13, 2017

(65) Prior Publication Data
US 2019/0020514 A1    Jan. 17, 2019

(51) Int. Cl.
H04L 27/04 (2006.01)
H04L 27/06 (2006.01)

(52) U.S. Cl.
CPC ............ *H04L 27/04* (2013.01); *H04L 27/06* (2013.01)

(58) Field of Classification Search
CPC .................................. H04L 27/04; H04L 27/06
See application file for complete search history.

(56) References Cited

U.S. PATENT DOCUMENTS

| | | | | |
|---|---|---|---|---|
| 6,151,335 A * | 11/2000 | Ko | ............................ | H04L 5/06 370/487 |
| 6,212,227 B1 * | 4/2001 | Ko | ........................ | H04M 11/062 375/222 |
| 7,106,803 B1 | 9/2006 | Hsu | | |
| 8,320,411 B1 * | 11/2012 | Sedarat | ................ | H04W 52/365 370/241 |
| 9,743,292 B2 * | 8/2017 | Barsoum | ................ | H04W 24/02 |
| 2005/0089126 A1 * | 4/2005 | Zerbe | ..................... | H04L 1/0003 375/353 |
| 2006/0140287 A1 * | 6/2006 | Alon | ...................... | H04L 5/1423 375/260 |

(Continued)

FOREIGN PATENT DOCUMENTS

| | | |
|---|---|---|
| CN | 1425240 A | 6/2003 |
| WO | 2006/049373 A1 | 5/2006 |
| WO | 2015/172375 A1 | 11/2015 |

OTHER PUBLICATIONS

International Search Report and Written Opinion dated Oct. 11, 2018 for International Application No. PCT/CN2018/095541, filed on Jul. 13, 2018 (9 pages).

*Primary Examiner* — Jean B Corrielus
(74) *Attorney, Agent, or Firm* — Perkins Coie LLP

(57) ABSTRACT

A digital communication technique, implementable in a digital communication system, includes performing a training phase in which the transmitter sends one or more transmissions of pulse amplitude modulation (PAM) signals wherein the PAM signals are modulated using one or more data-to-PAM-symbol mapping schemes, performing a feedback phase in which the transmitter receives a feedback message from a receiver, the feedback message indicative of a change to be made to data-to-PAM-symbol modulation schemes, and implementing a data transmission phase in which data is transmitted using a current PAM symbol mapping scheme based on the feedback message, wherein at least some symbols of the current PAM symbol modulation scheme are unequally spaced with respect to each other.

26 Claims, 22 Drawing Sheets

(56) References Cited

U.S. PATENT DOCUMENTS

| | | | | |
|---|---|---|---|---|
| 2009/0161781 A1* | 6/2009 | Kolze | ................... | H04L 25/022 375/260 |
| 2015/0171963 A1* | 6/2015 | Bhoja | ................ | H04B 10/2575 398/115 |
| 2016/0149730 A1* | 5/2016 | Navid | ............... | H04L 25/03343 375/233 |

* cited by examiner

UNEQUALLY SPACED PULSE AMPLITUDE MODULATION SCHEME

TECHNICAL FIELD

This patent document relates to digital communication, and, in one aspect, optical communication systems that use pulse amplitude modulation.

BACKGROUND

There is an ever-growing demand for data communication in application areas such as wireless communication, fiber optic communication and so on. The demand on core and access networks are all growing higher because not only are user devices such as smartphones and computers using more and more bandwidth due to multimedia applications, but also the total number of devices for which data is carried over the whole network is increasing. For profitability and to meet increasing demand, equipment manufacturers and network operators are continually looking for ways in which operational and capital expenditure can be reduced.

SUMMARY

The present document discloses techniques for using a pulse amplitude (PAM) modulation format in which unequal signal levels are used for data modulation. In some examples, the unequal signal levels are determined by two-way communication between a transmitter and a receiver.

In one example aspect, a method of digital communication, implementable at a transmitter in a digital communication system, is disclosed. The method includes performing a training phase in which the transmitter sends one or more transmissions of pulse amplitude modulation (PAM) signals wherein the PAM signals are modulated using one or more data-to-PAM-symbol mapping schemes, performing a feedback phase in which the transmitter receives a feedback message from a receiver, the feedback message indicative of a change to be made to data-to-PAM-symbol modulation schemes, and implementing a data transmission phase in which data is transmitted using a current PAM symbol mapping scheme based on the feedback message, wherein at least some symbols of the current PAM symbol modulation scheme are unequally spaced with respect to each other.

In another aspect, a method of digital communication, implementable at a receiver in a digital communication system, is disclosed. The method includes performing a training phase in which the receiver receives one or more transmissions of pulse amplitude modulation (PAM) signals wherein the PAM signals are modulated using one or more data-to-PAM-symbol mapping schemes, performing a feedback phase in which the receiver transmits a feedback message to a transmitter, the feedback message indicative of a change to be made to data-to-PAM-symbol modulation schemes, and implementing a data reception phase in which data is received using a current PAM symbol mapping scheme based on the feedback message, wherein at least some symbols of the current PAM symbol modulation scheme are unequally spaced with respect to each other.

In yet another aspect, an optical communication receiver apparatus is disclosed. The apparatus includes a transmission circuit that is configured to send one or more transmissions of pulse amplitude modulation (PAM) signals during a transmission phase, wherein the PAM signals are modulated using one or more data-to-PAM-symbol mapping schemes, a receiver circuit that is configured to receiver, during a feedback phase, a feedback message, the feedback message indicative of a change to be made to data-to-PAM-symbol modulation schemes, and a processor that controls operations of the optical communication apparatus to transmit data during a data transmission phase using a current PAM symbol mapping scheme based on the feedback message, wherein at least some symbols of the current PAM symbol modulation scheme are unequally spaced with respect to each other.

In another example aspect, a communication apparatus is disclosed. The apparatus includes a receiver circuit that is configured to receive, during a training phase, one or more transmissions of pulse amplitude modulation (PAM) signals wherein the PAM signals are modulated using one or more data-to-PAM-symbol mapping schemes, a transmitter circuit that is configured to transmit, during a feedback phase, a feedback message, the feedback message indicative of a change to be made to data-to-PAM-symbol modulation schemes, and a processor configured to implement a data reception phase in which data is received using a current PAM symbol mapping scheme based on the feedback message, wherein at least some symbols of the current PAM symbol modulation scheme are unequally spaced with respect to each other These, and other aspects, are disclosed in the present document.

DETAILED DESCRIPTION

Figure 1:
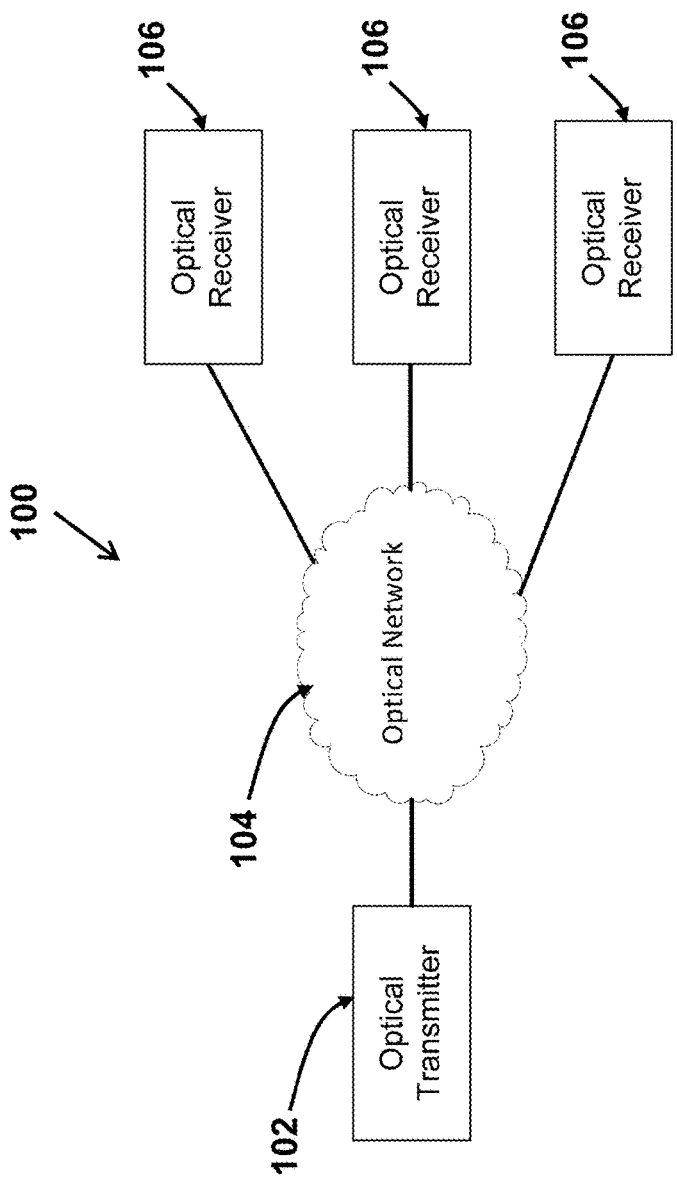
FIG. 1 is a block diagram of an example optical communication network.

The fast-growing data and services, such as cloud, mobile front-haul and HD video streaming applications, drive the demand of higher bit-rate in shot-range optical communications, such as inter- and intra-data center connection and optical access networks, which requires systems that can support higher capacity.

To meet this capacity needs, shot-range optical communication, such passive optical network for access and also intra- and inter-data center Ethernet connection, are moving from the classic spectral inefficient non-return to zero (NRZ), to more advanced modulation formats with digital signal processing (DSP).

However, intensity modulation with direct detection (IM/DD) is more suitable than coherent system for short reach applications in terms of cost, footprint and power consumption.

Due to the simple setup, low-cost and doubled spectrum efficiency (SE) compared with non-return-to-zero (NRZ) signal, PAM-4 has attracted a lot of research interest in both optical access network and also short-range data-center interconnections, which has been accepted as the waveform in IEEE 802.3bs for 400 GE data connections.

Compared with NRZ, PAM-4 maybe a suitable approach for higher spectral efficiency, however, it has the expense of higher receiver sensitivity requirement.

In order to support the specific link power budgets, optical pre-amplifier (based on Erbium-doped fiber amplifier (EDFA), or Semiconductor optical amplifier (SOA) before PIN photo-detector or high sensitivity photo-detectors such as Avalanche photodiode (APD) are used.

However, in these system (optical pre-amplifier detection or APD) with PAM signal modulation, noise distribution is different for different signal levels, namely, the noise distribution is related to modulation level (power) and non-uniform. It causes implementation penalties to these systems.

In this patent document, we disclose a design of the unequally spaced PAM signal for IM/DD system with optical pre-amplifier or APD receiver, to improve the system performances.

We also describe various embodiments of system level operation on noise distribution information feedback and signal design. While the example of PAM-4 signals is used in the drawings and description, it will be understood that the disclosed techniques can also be practiced form other PAM-N modulation schemes where N is an integer other than 4.

Experimental results have confirmed the benefits of the disclosed schemes.

FIG. 1 depicts an optical communication system 100 in which the presently disclosed technology can be practiced. One or more optical transmitters 102 are communicatively coupled via an optical network 104 with one or more optical receivers 106. The optical network 104 may comprise optical fibers that extend in length from several hundred feet (e.g., last mile drop) to several thousands of kilometers (long haul networks). The transmitted optical signals may go through intermediate optical equipment such as amplifiers, repeaters, switch, etc., which are not shown in FIG. 1 for clarity. The techniques described in the present document may be implemented by the optical transmitter 102 and/or the optical receivers 106.

Figure 2:
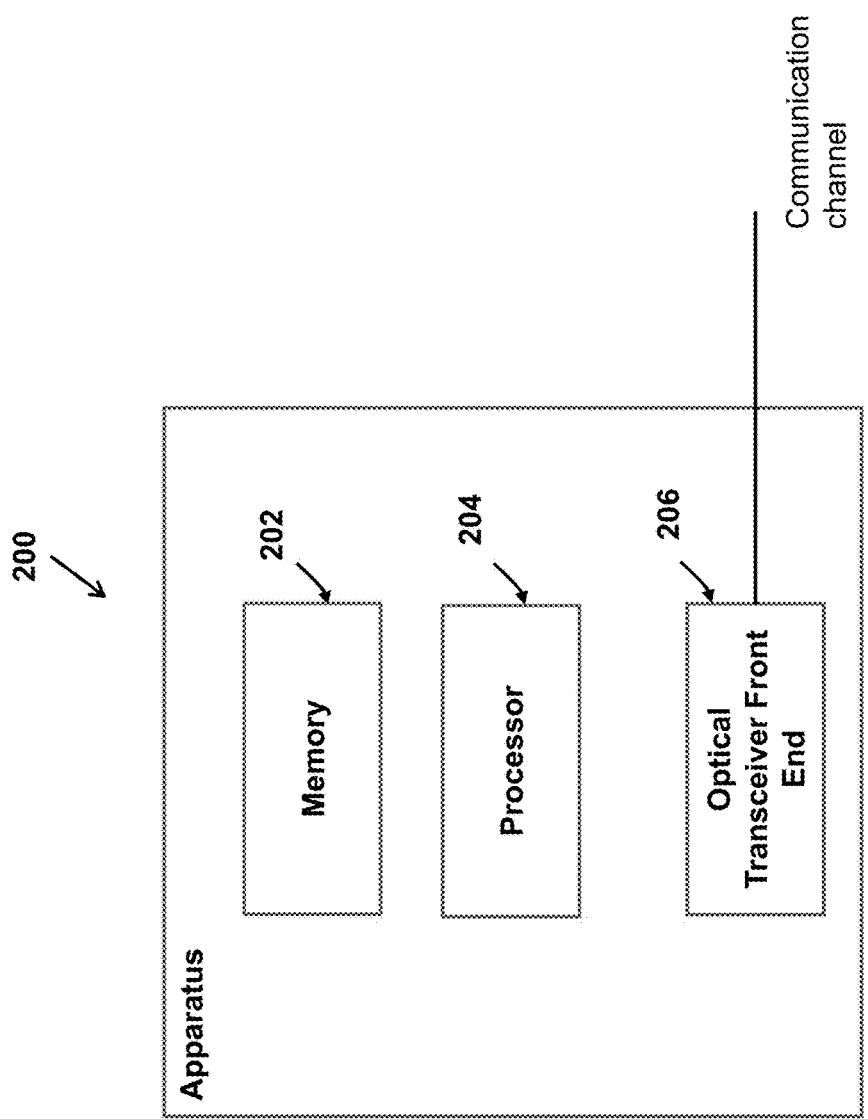
FIG. 2 is a block diagram of an example communication apparatus.

FIG. 2 is a block diagram of an example communication apparatus 200. The apparatus 200 may include one or more memories 202, one or more processors 204 and an optical receiver or transceiver front end 206 that is coupled with a communication link 208. The memory 202 may store processor-executable instructions and/or data during processor operation. The processor 204 may read instructions from the one or memories 202 and implement a technique described in the present document. The optical front end may be coupled to the processor and may receive transmissions from the communication link 208 and convert them into digital signals that are then processed by the processor 204 or other circuitry in the apparatus 200 (not shown in FIG. 2). The apparatus 200 may represent embodiment of the transmitter 102 or the receiver 106 and may be capable of implementing methods 1400 and 1500 described herein.

This patent document is focused on these two different types of PAM modulated IM/DD optical systems, to improve the receiver sensitivity for these two receivers.

Figure 3:
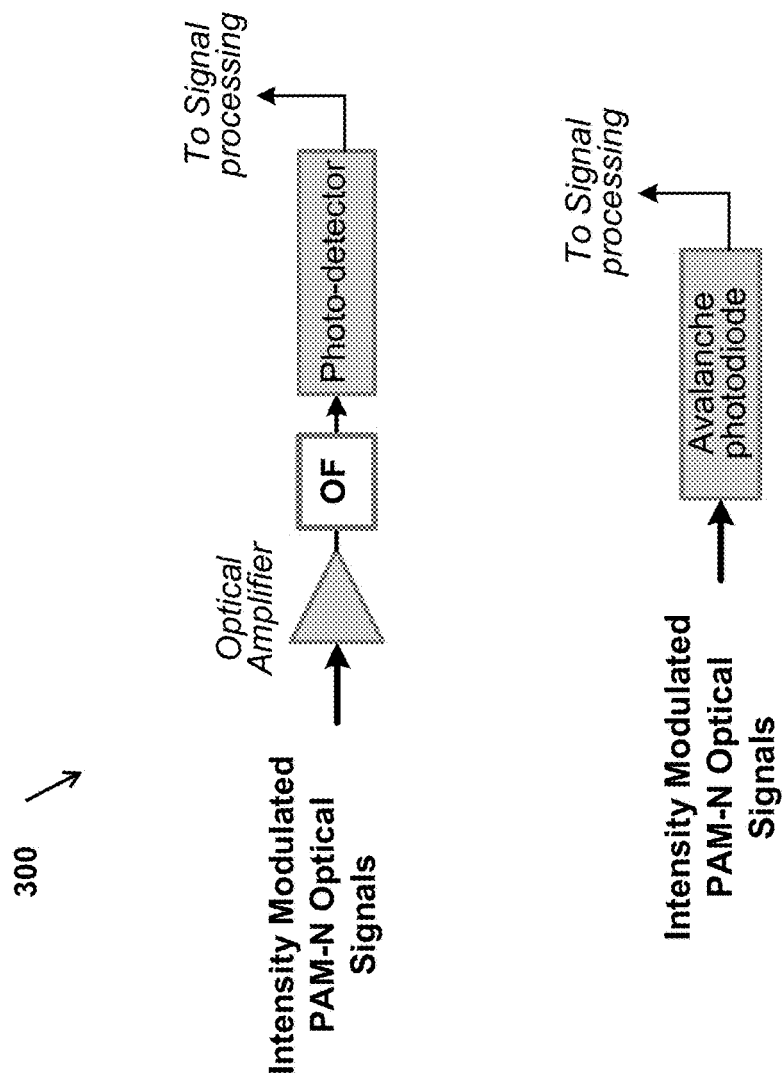
FIG. 3 shows examples of schemes used for optical signal detection and processing at an optical receiver.

FIG. 3 an example embodiment in which signals detection at an optical receiver is performed with optical pre-amplifiers. In various embodiments, the optical amplifier (OA) may be of an erbium doped fiber amplifier (EFDA) or a semiconductor optical amplifier (SOA). Intensity modulated PAM optical signal may be input to the OA. The amplified signal may be filtered through an optical filter (OF) and the filtered output may be passed through a photo detector for performing optical to electrical domain conversion. The resulting electrical signal may then be passed to the signal processing modules in the receiver.

Figure 4:
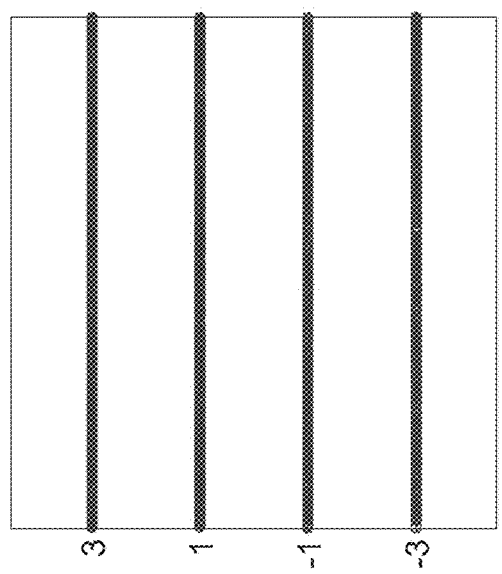
FIG. 4 is a graphical representation of an equally spaced PAM-4 constellation.

FIG. 4 shows an example where signal detection is performed using an avalanche photodiode (APD). The resulting electrical domain signal is than passed to signal processing modules in the receiver.

A typical noise distribution encountered by implementations in the EDFA or SOA based detection along with a PIN diode can be explained as follows. For example, noise in direct detection with optical pre-amplifier can be derived as follows:

Assuming the gain of Optical amplifier is G, during photodetection, the amplified spontaneous emission (ASE) noise will beat with the optical signal and create noise in the receiver known as signal-spontaneous beat noise, as $$\langle i_{sig-sp}^2 \rangle = 2h\nu R^2 G^2 F_n P_{in} \Delta f \qquad \text{Eq. (1)}$$

Here $F_n$ is the noise figure of the amplifier, v is the frequency of the optical signal, and h is Planck's constant, R is the responsivity of the photo-detector, and $P_{in}$ is the input power of received optical signals, and $\Delta f$ is the signal bandwidth.

Other noise sources are spontaneous—spontaneous beat noise and shot-noise spontaneous beat noise. When using a narrow optical bandpass filter, spontaneous—spontaneous beat noise, as well as shot-noise spontaneous beat noise can be greatly reduced. In this case, the signal-spontaneous beat noise dominates among all the noise sources.

$$\langle i_{sig-sp}^2 \rangle = 2h\nu R^2 G^2 F_n P_{in} \Delta f \qquad \text{Eq. (2)}$$

The above analysis shows that the noise added to detected signal is power-related, and dependent on the signal modulation level. In other words, N-level PAM-N signals will have different noise distribution on different levels; the higher the signal level, the greater the noise power or distribution variance.

Figure 5:
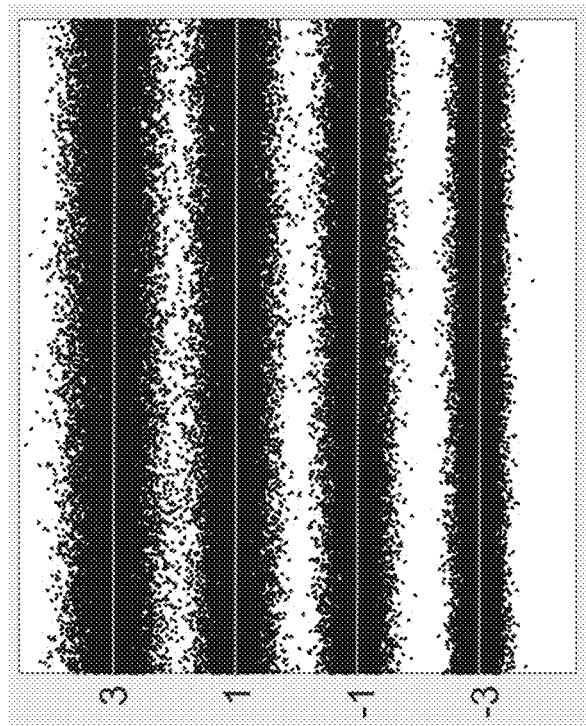
FIG. 5 shows received PAM-4 signal in an example embodiment in which detection is performed by an optical-pre amplifier and a PIN.

FIG. 5 shows receive PAM-4 signal in an example embodiment in which detection is performed by an optical-pre-amplifier and a PIN. The PAM-4 signal is shown to have four amplitude (and corresponding power) levels.

Figure 6:
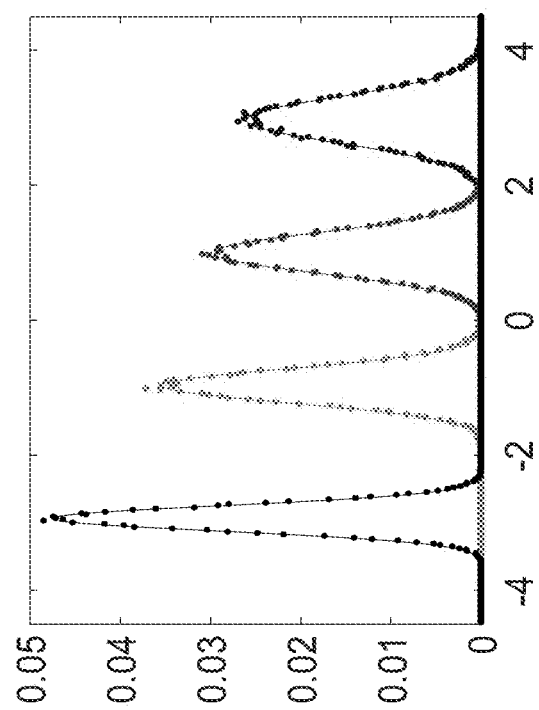
FIG. 6 shows an example of noise distribution of a received PAM-4 signal.

FIG. 6 shows an example of probability of distribution of a received PAM-4 signal. Measurements and a visual inspection of the graph shown in FIG. 6 confirm that the noise added to a signal detected at the receiver-side is a function of the signal modulation level. Therefore, in general, N-level PAM-N signals will have different amounts of noise distributions at different signal levels.

Figure 7:
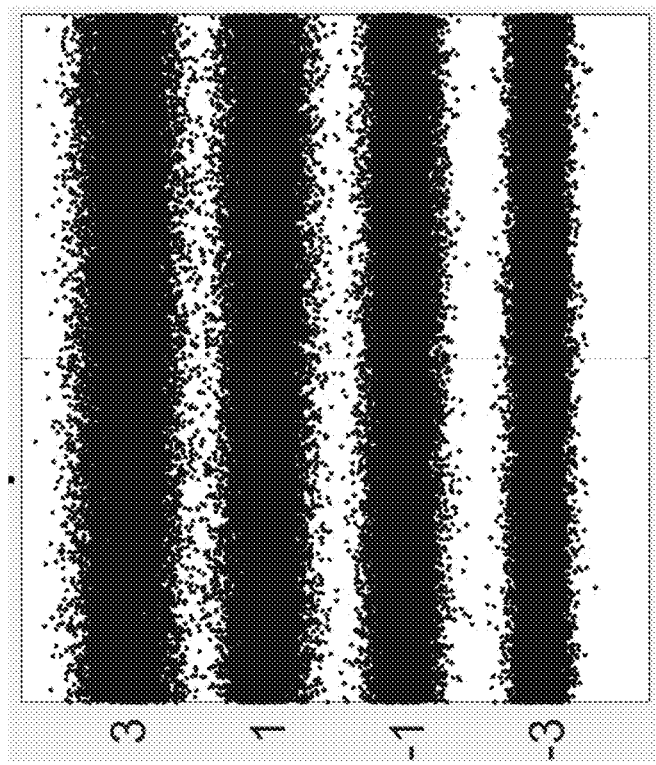
FIG. 7 shows received PAM-4 signal in an example embodiment of an optical receiver in which detection is performed by an APD.

FIG. 7 shows receive PAM-4 signal in an example embodiment in which detection is performed by an APD.

Figure 8:
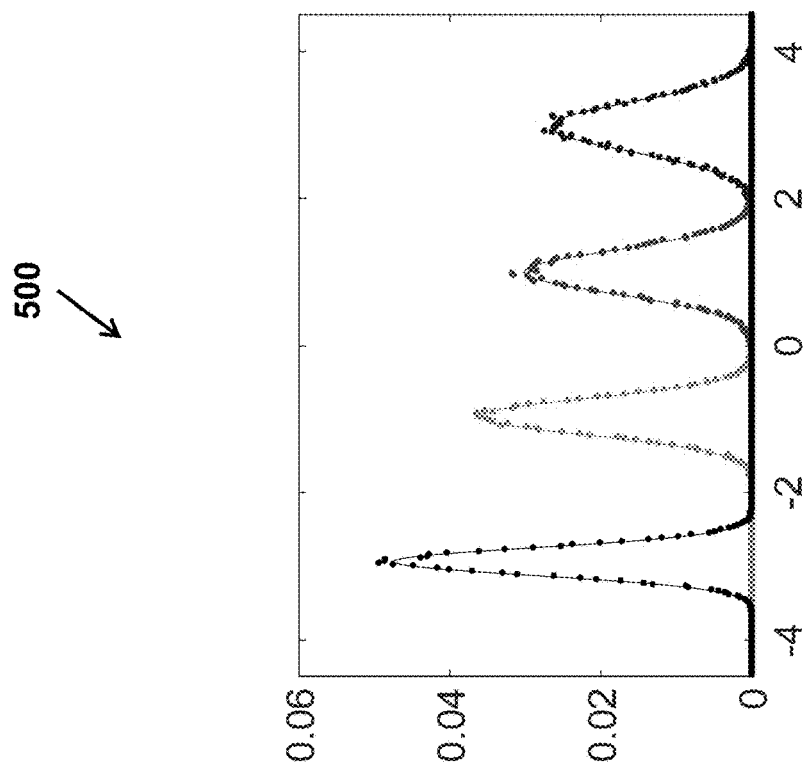
FIG. 8 shows an example of noise distribution of a received PAM-4 signal.

FIG. 8 shows an example of probability of distribution of a received PAM-4 signal. As can be seen from the graph, the noise distribution is a function of PAM level, with noise distribution being narrower at the low levels, and wider at the higher PAM signal levels. In the graph, the solid like is a Gaussian function, while the dashed lines are based on actual observations.

Optical receivers that use an APD generally provide higher receiver sensitivity due to internal gain. This increases the photocurrent by a multiplication factor M. The noise in an APD receiver comes from two main sources: one is a thermal noise and the other is shot-noise. The contribution of shot-noise may be significant due to the large multiplication factor M in APD implementations.

The shot noise generated by an APD can be represented as:

$$\langle i_n^2 \rangle = 2qM^2 IF\Delta f = 2qM^2(I_{ph}+I_d)F\Delta f \approx 2qM^2 RP_{in}F\Delta f \qquad \text{Eq. (3)}$$

Here the q is the elementary charge, Iph and Id are the generated photocurrent, and dark current. F is the noise figure of APD, R is the responsivity, and $\Delta f$ the effective signal bandwidth. Thus, the noise added to APD-detected signal is also power-related, and dependent with the signal modulation level. N-level PAM-N signals have different noise distribution on different levels; The higher the signal level, the greater the noise power or distribution variance.

FIG. 7 shows equally spaced PAM-4 signals after detection APD. Similar to receiver with optical pre-amplifier, noise added to APD detected signal is also power-related, and dependent with the signal modulation level. N-level PAM-N signals have different noise distribution on different levels; The higher the signal level, the greater the noise power or distribution variance.

FIG. 8 shows equally spaced PAM-4 signals distributions for each level after APD detection. The dashed curve represents the probability density received PAM-4 signals, and the solid curve represents calculated Gaussian distribution fit curve.

Figure 9:
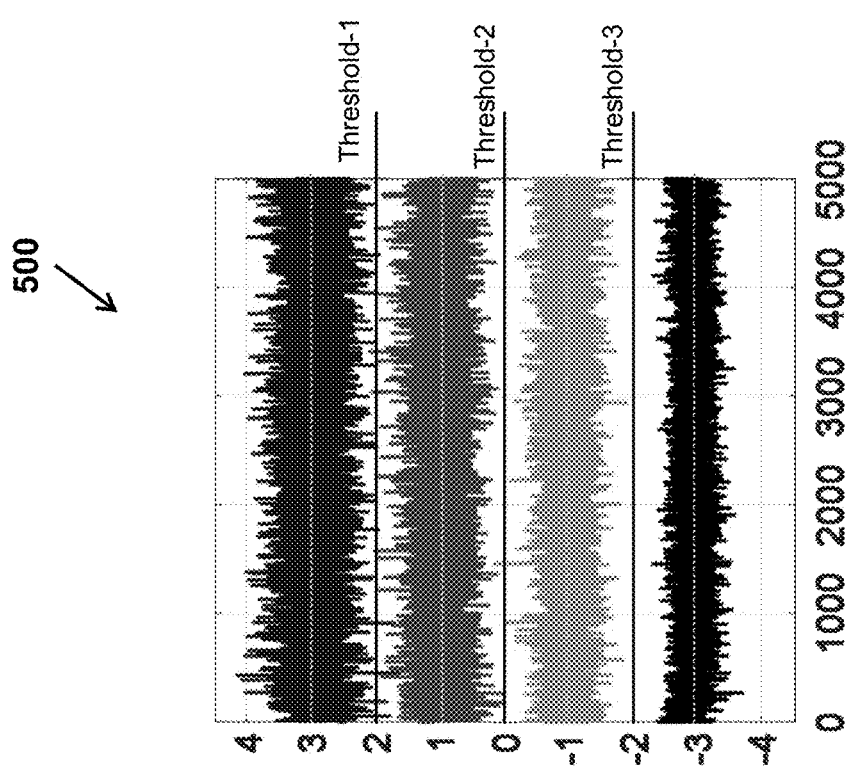
FIG. 9 shows an example of the use of a threshold in making received symbol decisions.

FIG. 9 shows an example of the use of a threshold in making received symbol decisions. In this example, equally spaced PAM-4 (as shown in FIG. 4) may be transmitted by a transmitter and the received signals may be decoded using the hard thresholds Threshold 1, Threshold 2 and Threshold 3, which are values 2, 0 and −2 respectively. Such a decision process usually picks the threshold to be at the center of two adjacent PAM levels, and thus may not be optimized in view of the observation that noise distribution tends to be non-uniform and level-dependent. From FIG. 9, it can be seen that while the lower level PAM symbols may be decoded quite successfully, noisy received signal will lead to errors at the higher PAM levels (e.g., when using Threshold 1).

Figure 10:
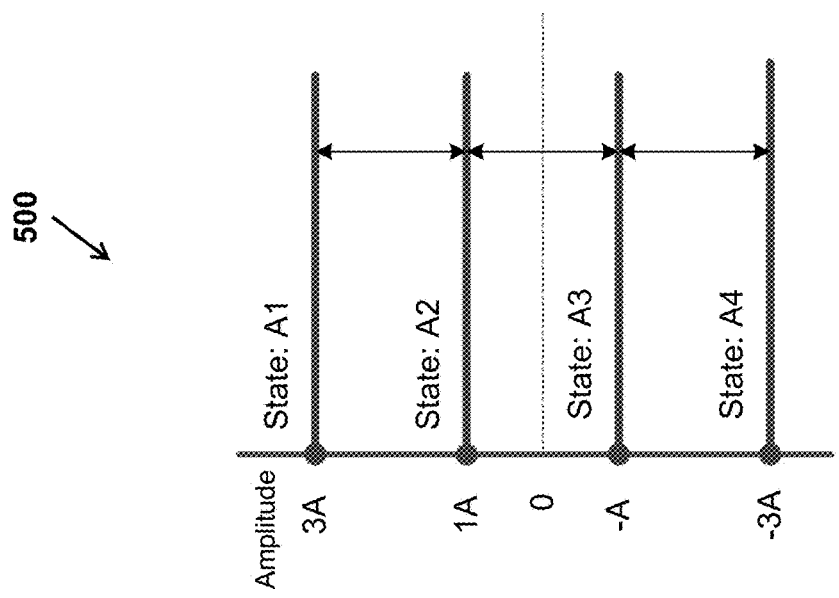
FIG. 10 shows an example of equally spaced PAM levels.

FIG. 10 shows an example of equally spaced PAM levels, and corresponding level spacing as are used in the traditional PAM-4 constellation such as the one shown in FIG. 4. The variable "A" represents amplitude of the PAM level, which may be implementation-specific.

Figure 11:
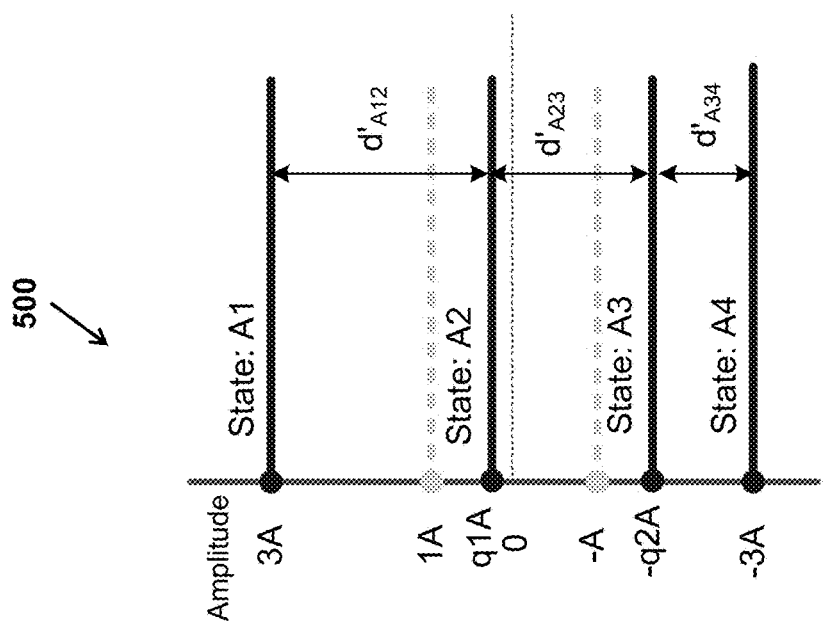
FIG. 11 shows an example of unequally spaced PAM levels.

FIG. 11 shows an example of unequally spaced PAM levels. The PAM-4 levels depicted in FIG. 11 are: 3A, q1A, −q2A and −3A. The signal amplitude difference or spacing between levels (starting from the highest) maybe denoted as d'A12, d'A23 and d'A34. These spacing may be in ratios that are determined from noise distribution estimation after detection. The greater the noise, the greater the spacing between the adjacent levels. It may further be seen from FIG. 11 that the PAM levels of the highest and the lowest constellation are kept similar to the uniformly distributed PAM signals. In other words, in some embodiments, the peak signal amplitudes or power sent over the medium may not be changed due to the non-uniform spacing of the PAM symbols levels.

Figure 12:
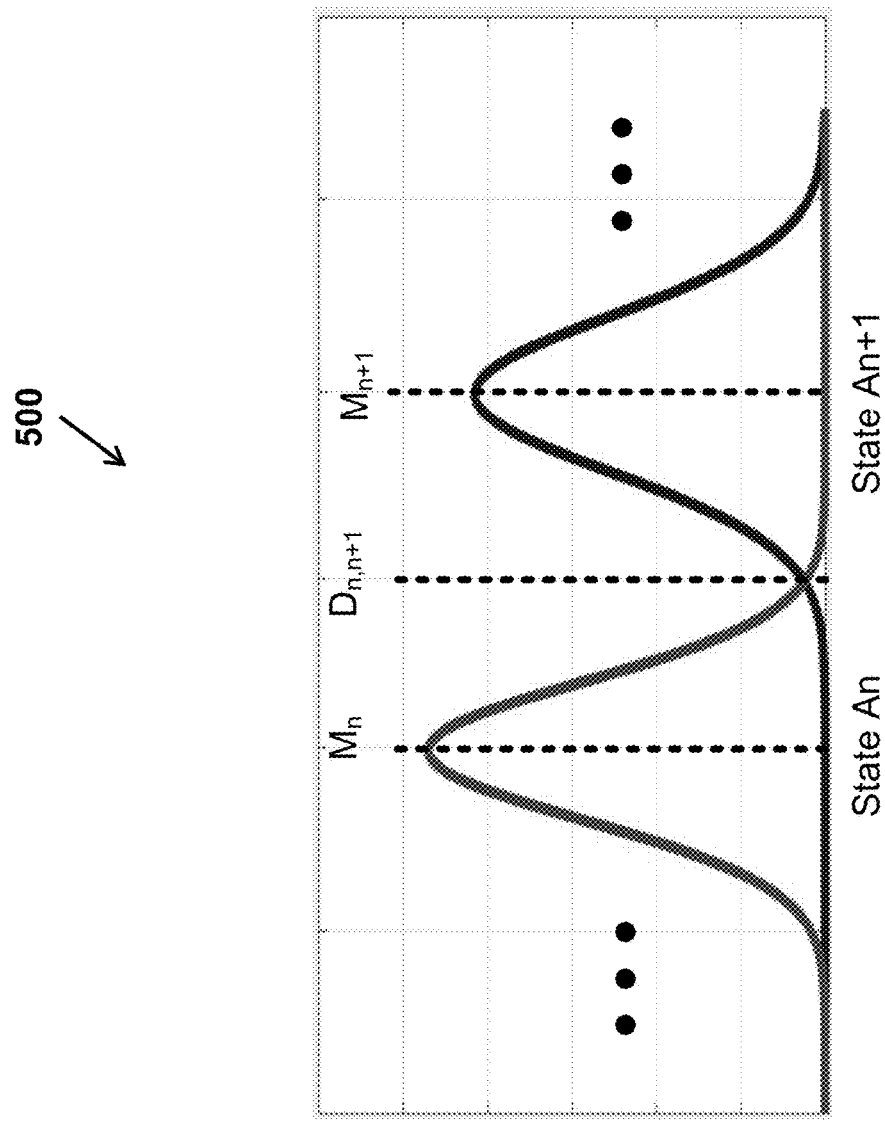
FIG. 12 is a graphical example of a decision threshold selection strategy used at a PAM receiver.

FIG. 12 is a graphical example of a decision strategy used at a PAM receiver. In some embodiments, PAM-N signals may be transmitted by a transmitter with unequal spacing for the PAM levels. Accordingly, at a receiver, an unequally spaced equalization and hard-decision scheme may be used. For example, as shown in FIG. 12, a hard decision threshold $D_{n,n+1}$ between two levels $M_n$ and $M_{n+1}$ may be selected based on the noise probability distributions for each of the levels $M_n$ and $M_{n+1}$. For example, if mean and variable of state An are $M_n$, and $\sigma_n$, and state An+1 are then $M_n$, and $\sigma_n$, then the hard-decision threshold is $D_{n,n+1}=(\sigma_n M_n + \sigma_{n+1} M_{n+1})/(\sigma_n + \sigma_{n+1})$.

Figure 13:
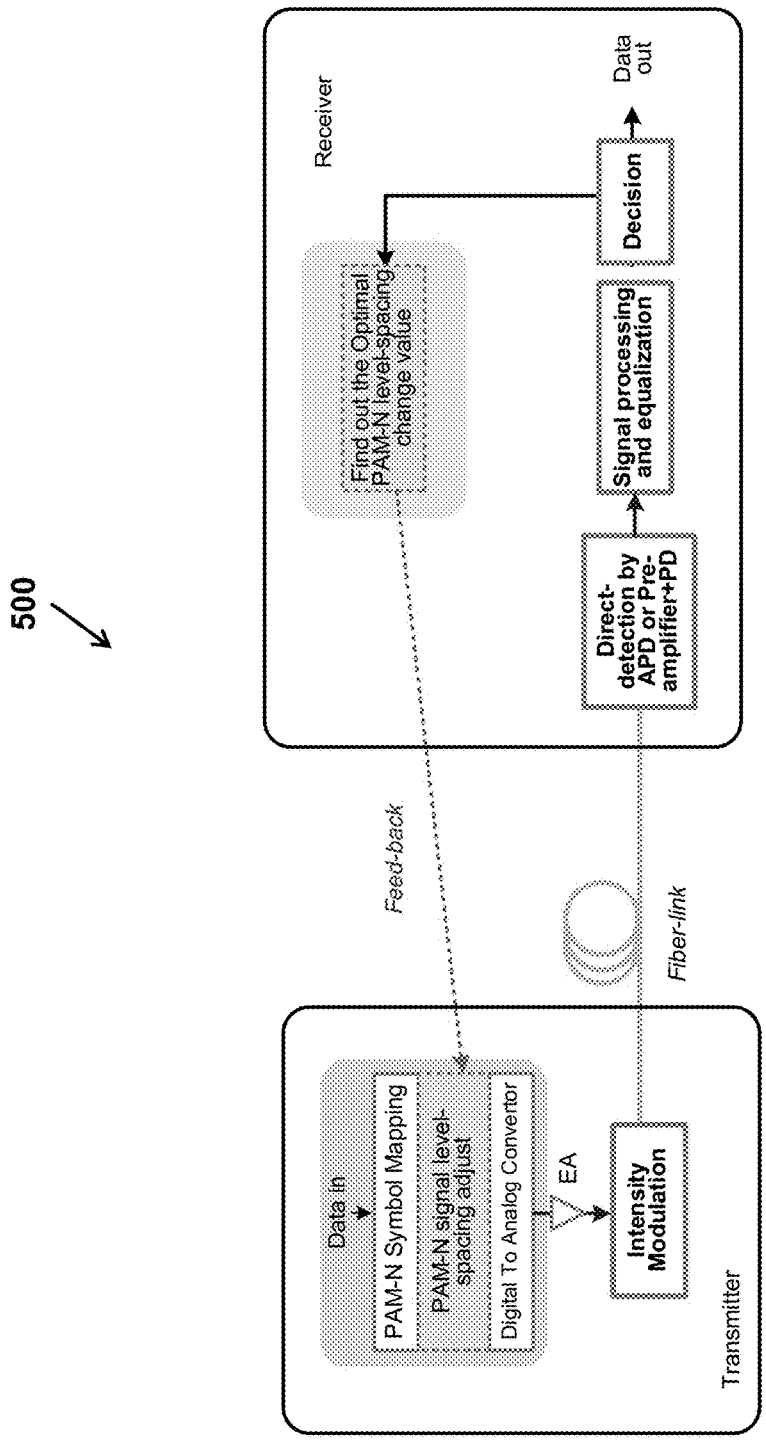
FIG. 13 is a block diagram of an example system for optical communication.

FIG. 13 is a block diagram of an example system for optical communication. The system may use PAM-N modulation setting in which the unequal spacings may be determined based on noise estimates. At the transmitter, data to be transmitted over the transmission medium may be received. The data may be received over an external interface or may be locally generated and may include user data and control data. The data map is mapped into PAM-N symbols based on the unequal spacing scheme. For example, in some embodiments, the data may be initially modulated to uniform amplitude levels and then the amplitude levels may be adjusted based on a current estimate of noise distribution observed at the receiver and communicated by the receiver to the transmitter via a feedback message. The PAM-N symbols may then be processed through a digital to analog converter and modulated into light signals through an optional amplifier and an intensity modulation module.

The unequally spaced PAM-N data may be transmitted over a transmission medium such as an optical fiber link. The signal may be received at a receiver. At the receiver, the signal may be converted into electrical signal by a technique such as direct detection by APD or a pre-amplifier and PD. Signal processing and equalization may be performed on the electrical signal. A decision may be made based on the equalized and processed digital signal levels. For example, a hard threshold decision may be made. The output data may thus include recovered data bits input at the receiver. Simultaneous with the decision making process, using statistics of the received signal, the receiver may determine an optimal PAM-N level spacing that should be used by the transmitter. The decision may be based on reducing bit error rate to a minimum value.

Various techniques may be used by which the unequal spacing is determined in such a system. In general, the determination may be performed in the following steps—a first step in which calibration is performed by the receiver, e.g., by measuring probabilities of the received PAM signal levels; and a second step in which the receive sends a feedback signal to the transmitter indicative of the unequal spacing that should be used. Finally, in the last step, the transmitter may perform signal modulation adjustments using the feedback signals.

In some embodiments, this method may as follows:

1. The Transmitter sends out different kinds of PAM-N signals with different level-spacing combinations as test or training signals.

2. The Receiver tests all the combinations, and find out the optimal one based on BERs. The receiver feeds back the information of which level-spacing should be used to the transmitter.

3. The transmitter sends out the unequally spaced PAM signals according to the feedback information.

4. Accordingly, change the receiver-side equalization and hard-decision threshold after signal detection.

In some embodiments, an iterative method as follows may be used.

1. The Transmitter sends out equally-spaced PAM-N training signals.

2. The Receiver calculates the PAM-N signals distribution on different levels, and designs the unequally-spaced PAM-N according to the noise distribution algorithms.

3. The receiver feeds back the information of what kinds of level-spacings should be used to the transmitter.

4. The transmitter sends out the unequally spaced PAM signals according to the feedback information.

5. Accordingly, change the receiver-side equalization and hard-decision threshold after signal detection The above steps may be repeated periodically to maintain or improve performance of the system.

With reference to the PAM-4 example depicted in FIG. 11, the following equations may be used to calculate the level spacing.

$$d'_{A12} + d'_{A23} + d'_{A34} = 6A;$$

$$d'_{A12}/d'_{A23} = (\sigma_{A1} + \sigma_{A2})/(\sigma_{A2} + \sigma_{A3});$$

$$d'_{A12}/d'_{A23} = (\sigma_{A1} + \sigma_{A2})/(\sigma_{A2} + \sigma_{A3}); \qquad \text{Eq. (4)}$$

Here, $\sigma_{A1} \sim \sigma_{An}$ is the variance of the received PAM-4 state (signal levels) A1~A4, respectively. They can be obtained at the receiver.

Figure 14:
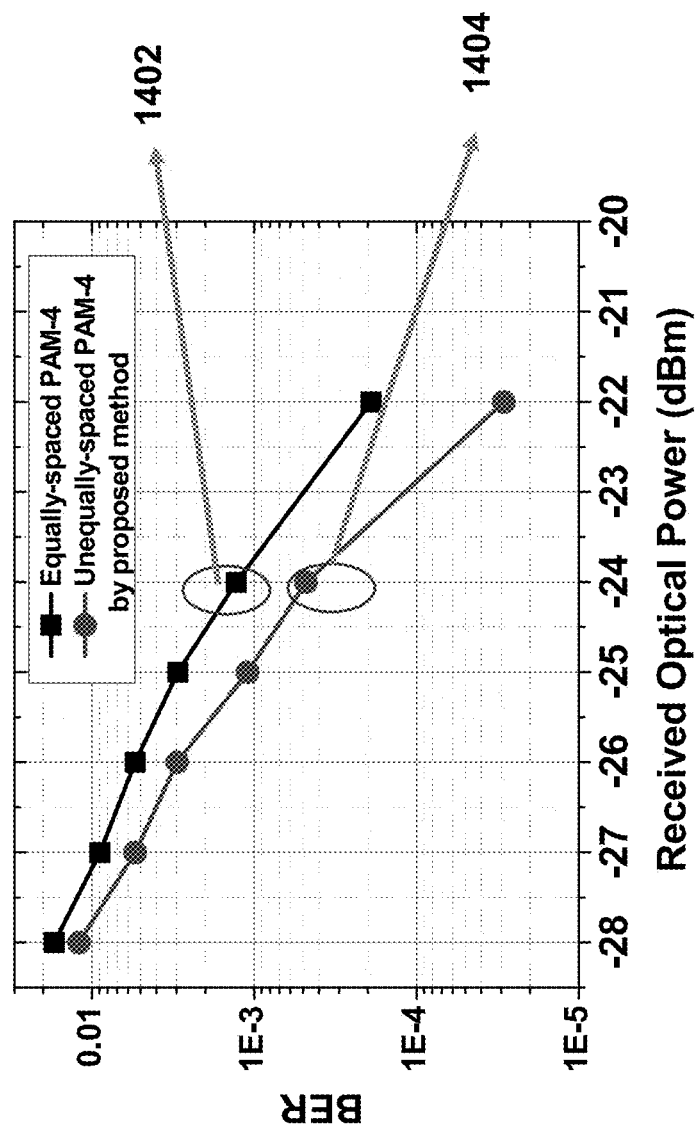
FIG. 14 is a graph showing performance results obtained in an embodiment of an optical receiver.

FIG. 14 is a graph showing performance results obtained in an embodiment of an optical receiver. The graphs show results obtained for a receiver that receives 50 Gb/s PAM-4 signal using an EDFA and a PIN. As can be seen by a comparison between points 1402 and 1404 in the graph, a 1 dB improvement at the BER of $1 \times 10^{-3}$ can be achieved using the unequally spaced PAM signals.

Figure 15:
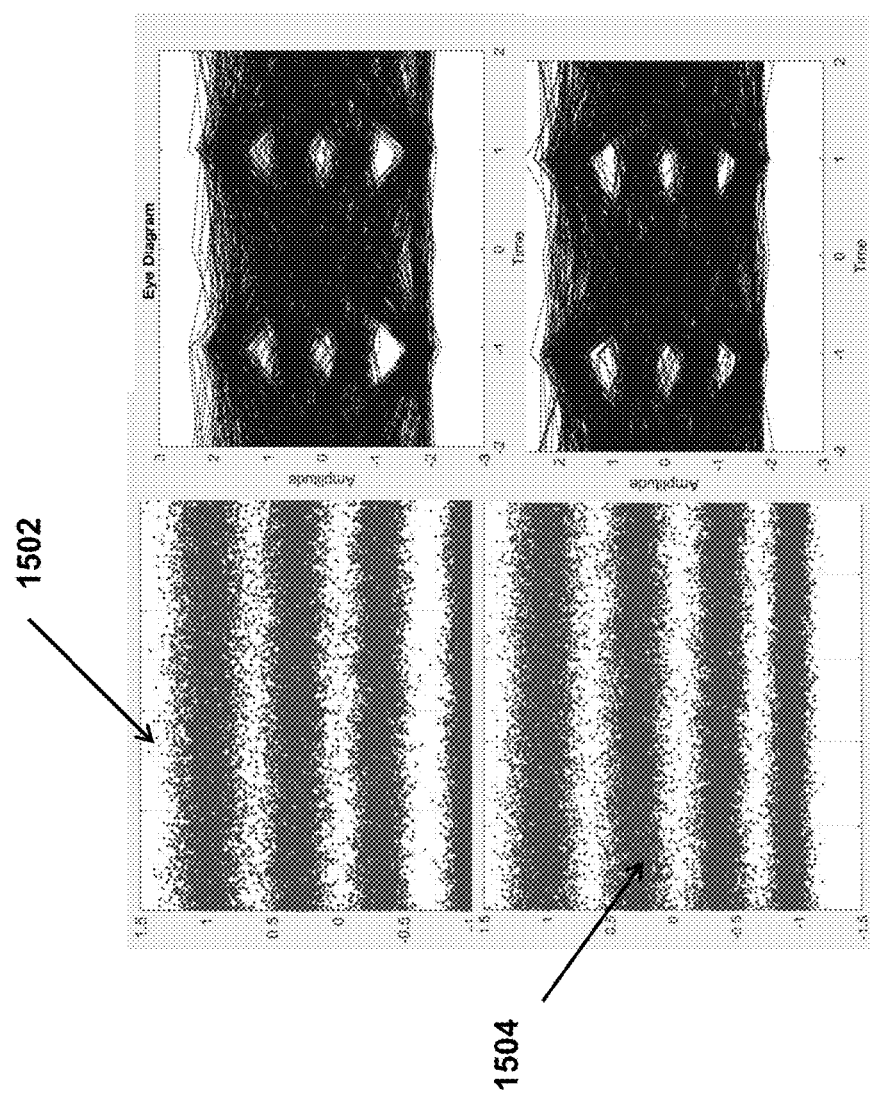
FIG. 15 is a graph showing performance results obtained in an embodiment of an optical receiver.

FIG. 15 shows examples of received signals at a receiver. The graph 1502 shows signals received at 1402, and the graph 1504 shows signals received at 1404. The left side shows the received signal levels and the right side shows a corresponding eye pattern.

Figure 16:
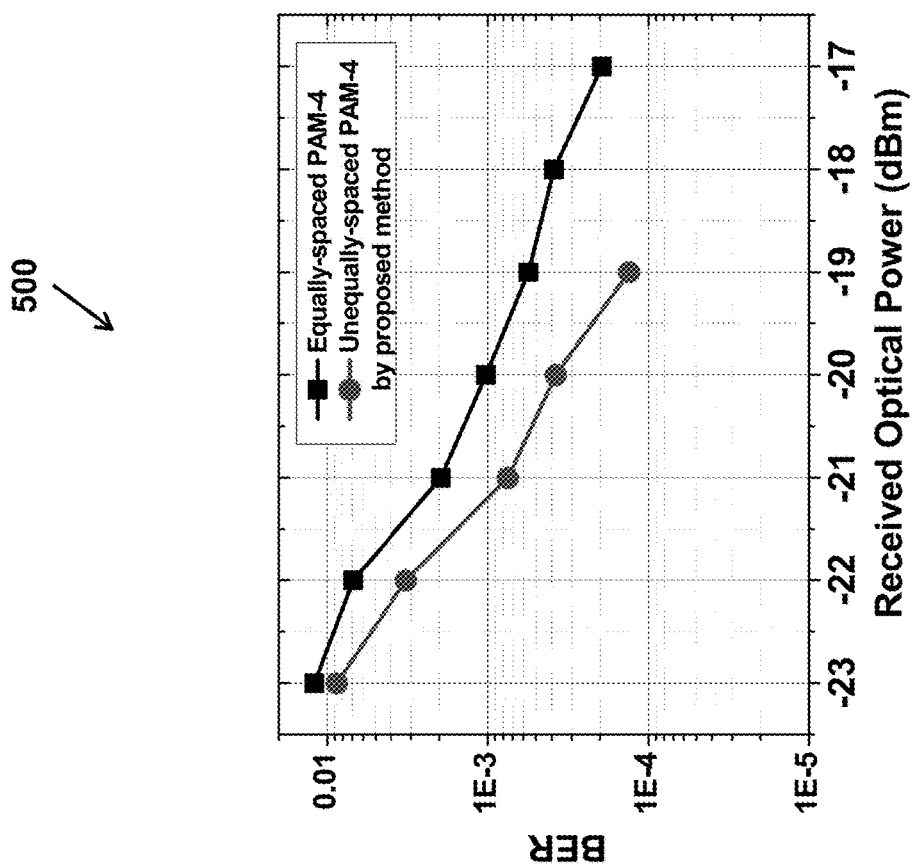
FIG. 16 is a graph showing performance results obtained in another embodiment of an optical receiver.

FIG. 16 is a graph showing performance results obtained in an optical receiver that uses APD as receiver. As can be seen from the graph, an improvement of about 1.2 dB is observed at BER of $1 \times 10^{-3}$.

Figure 17:
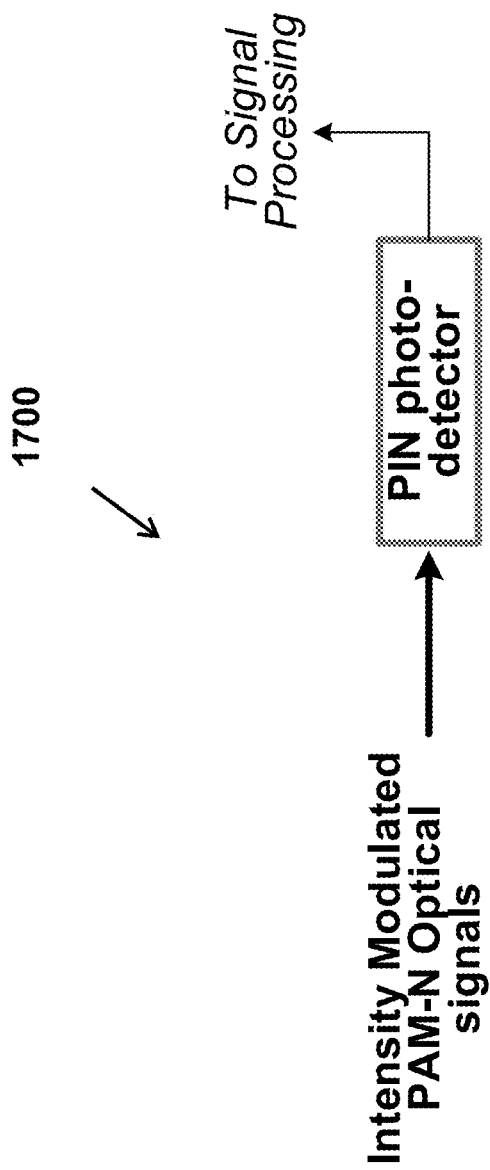
FIG. 17 shows an example of a receiver that uses a PIN photo-detector only.

FIG. 17 shows an example of a receiver 1700 that uses a PIN photo-detector only. Typically when using a PIN photo-detector, thermal noise may be the dominant source of noise in PAM signal corruption. Thermal noise is due to the random motion of electrons in resistors or other electronic components. The effect of this thermal motion of electrons is to produce a randomly varying voltage or current, called thermal noise. Thermal noise can be represented as a voltage source, vth, in series with the resistor or a current source, ith, in parallel with the resistor. The mean-squared values of the thermal noise are $$\langle i_{th}^2 \rangle = 4k_B T \Delta f / R_L \qquad \text{Eq. (5)}$$

where kB is the Boltzmann constant, T the absolute temperature, RL the load resistance, and $\Delta f$ the effective bandwidth.

From Eq. (5), it can be seen that the main noise source for PIN receiver, thermal noise, has no relation to the input power. Therefore, N-level PAM signals have the same noise distributions for each modulation levels would be expected at the receiver.

Figure 18:
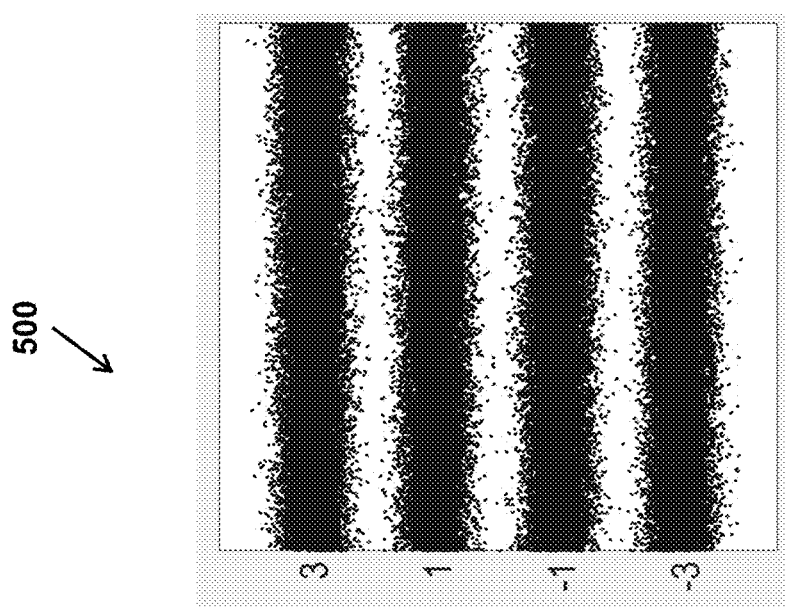
FIG. 18 shows an example of a received PAM-4 signal at an optical receiver that uses a PIN photo-diode only reception technique.

FIG. 18 shows an example of a uniformly encoded PAM-4 signal at an optical receiver 1700 that uses a PIN photo-detector only.

Figure 19:
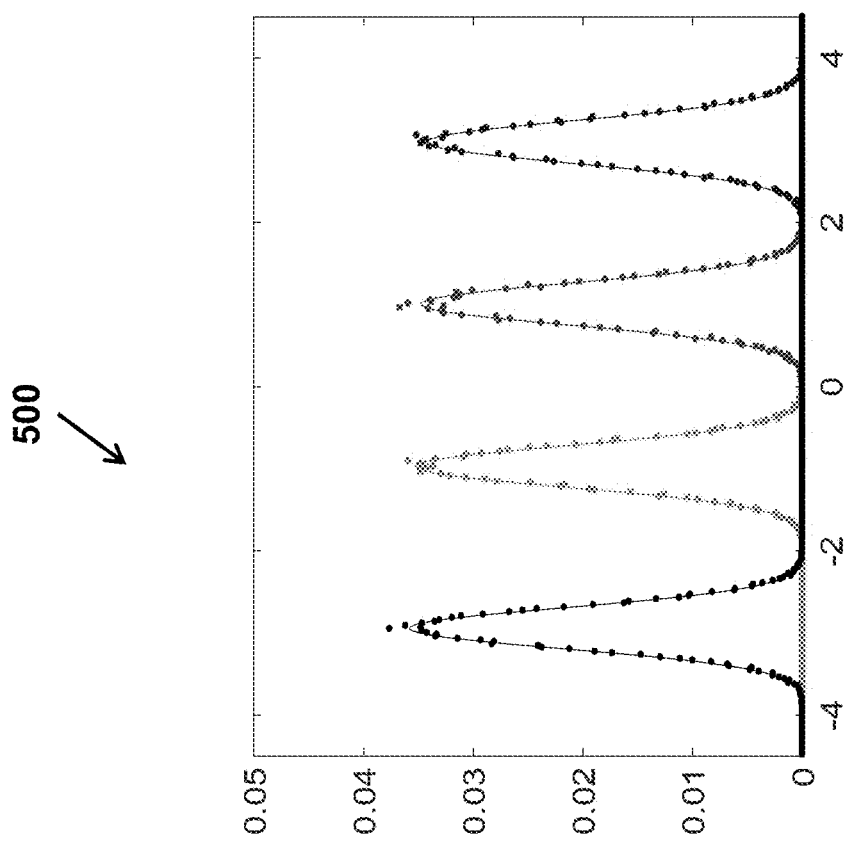
FIG. 19 shows an example of noise distribution of a received PAM-4 signal for the receiver depicted in FIG. 18.

FIG. 19 shows the corresponding noise distribution observed at the receiver 1700. It can be seen that the noise distribution is uniformly similar for all PAM levels.

Figure 20:
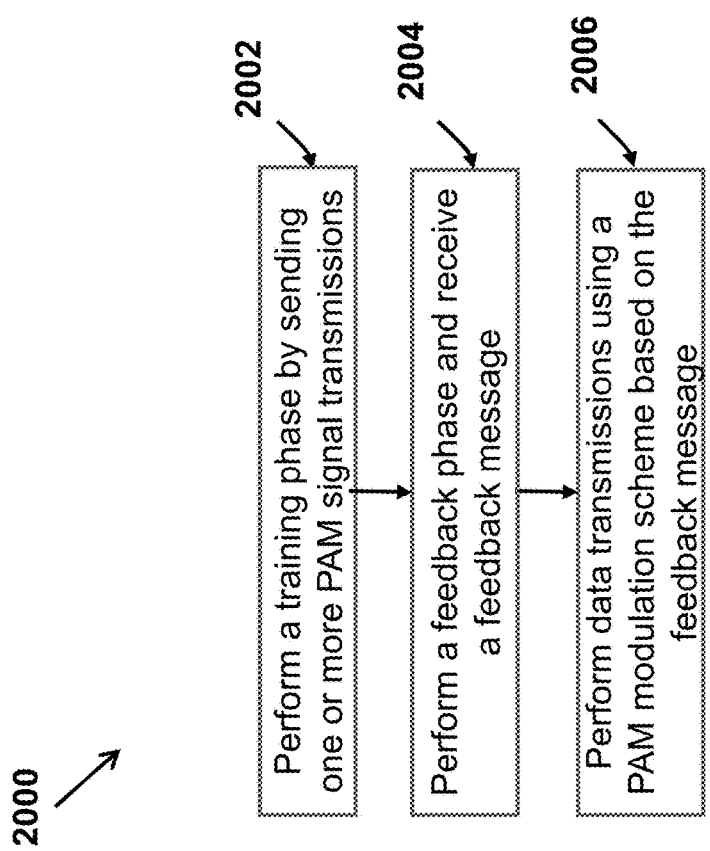
FIG. 20 is a flowchart for an example method of optical communication.

FIG. 20 is a flowchart for an example method 2000 of optical communication. The method 2000 may be implemented by an optical transmission apparatus that transmits data over an optical connection to a receiver apparatus. The method 2000 includes operations of performing (2002) a training phase in which the transmitter sends one or more transmissions of pulse amplitude modulation (PAM) signals wherein the PAM signals are modulated using one or more data-to-PAM-symbol mapping schemes, performing (2004) a feedback phase in which the transmitter receives a feedback message from a receiver, the feedback message indicative of a change to be made to data-to-PAM-symbol modulation schemes, and implementing (2006) a data transmission phase in which data is transmitted using a current PAM symbol mapping scheme based on the feedback message, wherein at least some symbols of the current PAM symbol modulation scheme are unequally spaced with respect to each other.

Figure 21:
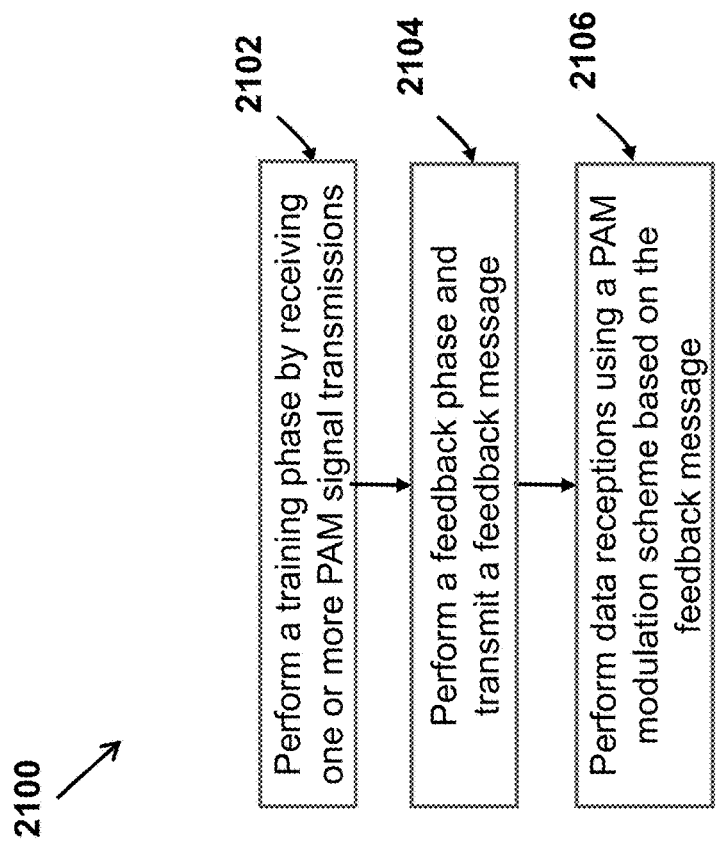
FIG. 21 is a flowchart for an example method of optical communication.

FIG. 21 is a flowchart for an example method 2100 of optical communication. The method 2100 may be performed by an optical receiver apparatus that receivers data transmissions over an optical communication network. The method 2100 includes the operations of performing (2102) a training phase in which the receiver receives one or more transmissions of pulse amplitude modulation (PAM) signals wherein the PAM signals are modulated using one or more data-to-PAM-symbol mapping schemes, performing (2104) a feedback phase in which the receiver transmits a feedback message to a transmitter, the feedback message indicative of a change to be made to data-to-PAM-symbol modulation schemes, and implementing (2106) a data reception phase in which data is received using a current PAM symbol mapping scheme based on the feedback message, wherein at least some symbols of the current PAM symbol modulation scheme are unequally spaced with respect to each other.

In methods 2000 and 2100, the one or more data-to-PAM-symbol mapping schemes may include a set of modulation schemes in which PAM symbols are unequally spaced, and the feedback message identifies one of the set of modulation schemes suitable for data transmission during the data transmission phase.

As described in the present document, the one or more data-to-PAM-symbol mapping schemes comprise a set of modulation schemes in which PAM symbols are unequally spaced, and wherein the feedback message includes receiver-side noise statistics, the method further including deciding, based on the receiver-side noise statistics, the current PAM symbol mapping scheme.

In methods 2000 and 2100, the current PAM symbol mapping scheme may be selected to have a symbol spacing that is proportion to noise distribution measured at each PAM symbol level. For example, the scheme described with respect to Eq. (4) and FIG. 10 to FIG. 12. In some embodiments, the maximum and minimum PAM symbol levels may be the same for all unequal spaced PAM symbols.

Figure 22:
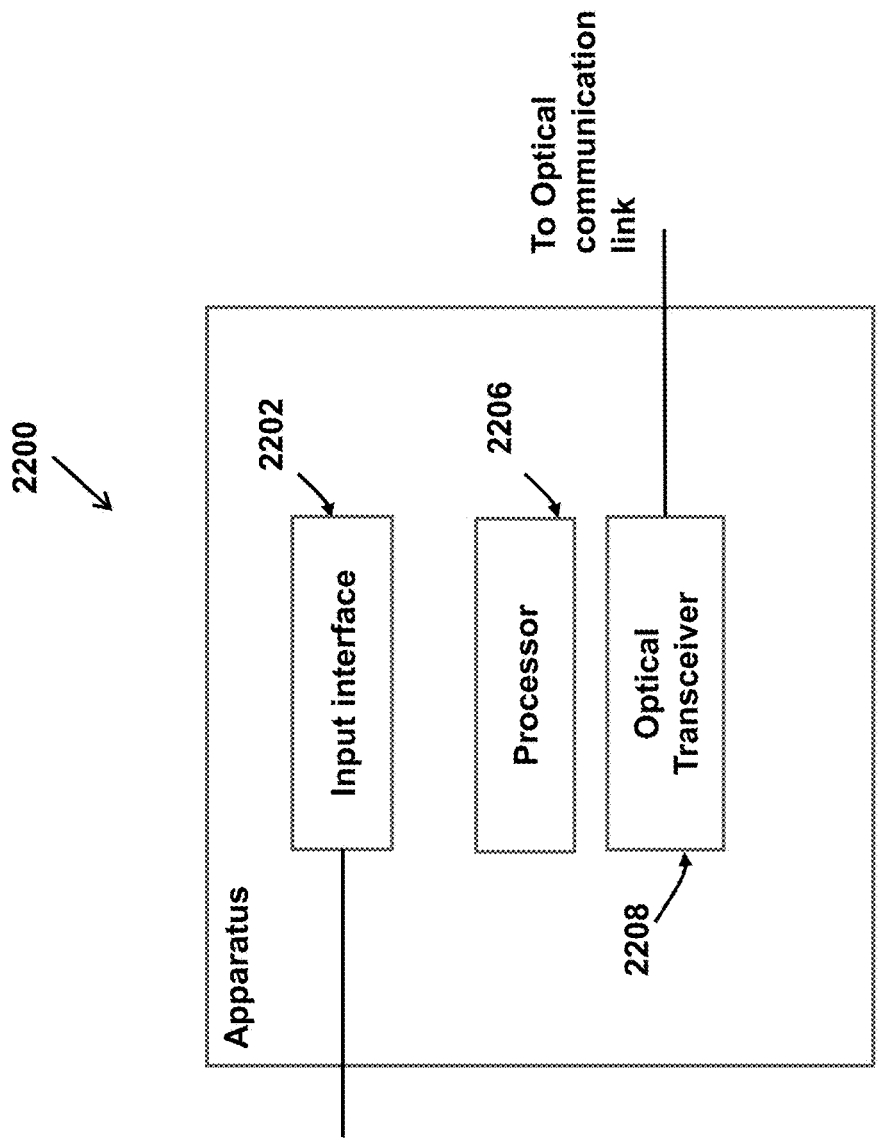
FIG. 22 is a block diagram of an example implementation of an optical transmitter or receiver apparatus.

FIG. 22 shows an example of an optical transmitter or receiver apparatus 2200 where the techniques described herein may be performed. The apparatus 2200 may be include an input interface 2202 at which user data may be received for transmission over an optical communication link. The apparatus may include a processor 2206 that is configured to perform the various techniques described in the present document. The apparatus 2200 may also include an optical transceiver 2208 that includes a transmitter circuit and a receiver circuit that performs various operations described herein.

It will be appreciated that techniques for optimizing the use of PAM signals in an optical communication system are disclosed. PAM signals may be adapted from time to time to modulate data to PAM symbols that are unequally spaced in proportion to the measured noise at each level. For example, the greater the spread of measured noise, the larger will be the separation between PAM levels. The measured noise may be quantified in terms of a distribution curve and modeled as a well-known distribution such as Gaussian. The amplitude of the distribution and its variance may be used to adjust the unequal spacing between PAM levels.

The disclosed and other embodiments, modules and the functional operations described in this document can be implemented in digital electronic circuitry, or in computer software, firmware, or hardware, including the structures disclosed in this document and their structural equivalents, or in combinations of one or more of them. The disclosed and other embodiments can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal, that is generated to encode information for transmission to suitable receiver apparatus.

A computer program (also known as a program, software, software application, script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this document can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this patent document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is what is described and illustrated, including:

1. A method of digital communication, implementable at a transmitter in a digital communication system, comprising:
    performing a training phase in which the transmitter sends one or more transmissions of pulse amplitude modulation (PAM) signals wherein the PAM signals are modulated using one or more data-to-PAM-symbol mapping schemes, wherein the one or more data-to-PAM-symbol mapping schemes comprise a set of modulation schemes in which PAM symbols are unequally spaced;
    performing a feedback phase in which the transmitter receives a feedback message from a receiver, the feedback message indicative of a change to be made to data-to-PAM-symbol mapping schemes, wherein the feedback message includes receiver-side noise statistics;
    deciding, based on the receiver-side noise statistics, a current PAM symbol mapping scheme, wherein the current PAM symbol mapping scheme is selected to have symbol spacing proportional to noise distribution measured at each PAM symbol level; and
    implementing a data transmission phase in which data is transmitted using the current PAM symbol mapping scheme based on the feedback message, wherein at least some symbols of the current PAM symbol mapping scheme are unequally spaced with respect to each other.

2. The method of claim 1, wherein the feedback message identifies one of the set of modulation schemes suitable for data transmission during the data transmission phase.

3. The method of claim 1, wherein the PAM signals include 4-PAM signals.

4. A method of digital communication, implementable at a transmitter in a digital communication system, comprising:
    performing a training phase in which the transmitter sends one or more transmissions of pulse amplitude modulation (PAM) signals wherein the PAM signals are modulated using one or more data-to-PAM-symbol mapping schemes, wherein the one or more data-to-PAM-symbol mapping schemes comprise a set of modulation schemes in which PAM symbols are unequally spaced, wherein a same maximum level and a same minimum amplitude level are used in each data-to-PAM-symbol mapping scheme;
    performing a feedback phase in which the transmitter receives a feedback message from a receiver, the feedback message indicative of a change to be made to data-to-PAM-symbol mapping schemes, wherein the feedback message includes receiver-side noise statistics;
    deciding, based on the receiver-side noise statistics, a current PAM symbol mapping scheme, wherein the current PAM symbol mapping scheme is selected to have symbol spacing proportional to noise distribution measured at each PAM symbol level; and
    implementing a data transmission phase in which data is transmitted using the current PAM symbol mapping scheme based on the feedback message, wherein at least some symbols of the current PAM symbol mapping scheme are unequally spaced with respect to each other.

5. The method of claim 4, wherein the feedback message identifies one of the set of modulation schemes suitable for data transmission during the data transmission phase.

6. The method of claim 4, wherein the PAM signals include 4-PAM signals.

7. A method of digital communication, implementable at a receiver in a digital communication system, comprising:
    performing a training phase in which the receiver receives one or more transmissions of pulse amplitude modulation (PAM) signals wherein the PAM signals are modulated using one or more data-to-PAM-symbol mapping schemes, wherein the one or more data-to-PAM-symbol mapping schemes comprise a set of modulation schemes in which PAM symbols are unequally spaced;
    performing a feedback phase in which the receiver transmits a feedback message to a transmitter, the feedback message indicative of a change to be made to data-to-PAM-symbol mapping schemes, wherein the feedback message includes receiver-side noise statistics;
    deciding, based on the receiver-side noise statistics, a current PAM symbol mapping scheme, wherein the current PAM symbol mapping scheme is selected to have symbol spacing proportional to noise distribution measured at each PAM symbol level; and
    implementing a data reception phase in which data is received using the current PAM symbol mapping scheme based on the feedback message, wherein at least some symbols of the current PAM symbol mapping scheme are unequally spaced with respect to each other.

8. The method of claim 7, wherein the feedback message identifies one of the set of modulation schemes suitable for data transmission during a data transmission phase.

9. The method of claim 7, wherein the PAM signals include 4-PAM signals.

10. A method of digital communication, implementable at a receiver in a digital communication system, comprising:
    performing a training phase in which the receiver receives one or more transmissions of pulse amplitude modulation (PAM) signals wherein the PAM signals are modulated using one or more data-to-PAM-symbol mapping schemes, wherein the one or more data-to-PAM-symbol mapping schemes comprise a set of modulation schemes in which PAM symbols are unequally spaced, wherein a same maximum level and a same minimum amplitude level are used in each data-to-PAM-symbol mapping scheme;
    performing a feedback phase in which the receiver transmits a feedback message to a transmitter, the feedback message indicative of a change to be made to data-to-PAM-symbol mapping schemes, wherein the feedback message includes receiver-side noise statistics;
    deciding, based on the receiver-side noise statistics, a current PAM symbol mapping scheme, wherein the current PAM symbol mapping scheme is selected to have symbol spacing proportional to noise distribution measured at each PAM symbol level; and
    implementing a data reception phase in which data is received using the current PAM symbol mapping scheme based on the feedback message, wherein at least some symbols of the current PAM symbol mapping scheme are unequally spaced with respect to each other.

11. The method of claim 10, wherein the feedback message identifies one of the set of modulation schemes suitable for data transmission during a data transmission phase.

12. The method of claim 10, wherein the PAM signals include 4-PAM signals.

13. An optical communication apparatus, comprising:
a transmission circuit that is configured to send one or more transmissions of pulse amplitude modulation (PAM) signals during a transmission phase, wherein the PAM signals are modulated using one or more data-to-PAM-symbol mapping schemes, wherein the one or more data-to-PAM-symbol mapping schemes comprise a set of modulation schemes in which PAM symbols are unequally spaced;
a receiver circuit that is configured to receive, during a feedback phase, a feedback message, the feedback message indicative of a change to be made to data-to-PAM-symbol mapping schemes, wherein the feedback message includes receiver-side noise statistics; and
a processor that controls operations of the optical communication apparatus to:
decide, based on the receiver-side noise statistics, a current PAM symbol mapping scheme, wherein the current PAM symbol mapping scheme is selected to have symbol spacing proportional to noise distribution measured at each PAM symbol level, and
transmit data during a data transmission phase using the current PAM symbol mapping scheme based on the feedback message, wherein at least some symbols of the current PAM symbol mapping scheme are unequally spaced with respect to each other.

14. The apparatus of claim 13, wherein the feedback message identifies one of the set of modulation schemes suitable for data transmission during the data transmission phase.

15. The apparatus of claim 13, wherein the PAM signals include 4-PAM signals.

16. An optical communication apparatus, comprising:
a transmission circuit that is configured to send one or more transmissions of pulse amplitude modulation (PAM) signals during a transmission phase, wherein the PAM signals are modulated using one or more data-to-PAM-symbol mapping schemes, wherein the one or more data-to-PAM-symbol mapping schemes comprise a set of modulation schemes in which PAM symbols are unequally spaced, wherein a same maximum level and a same minimum amplitude level are used in each data-to-PAM-symbol mapping scheme;
a receiver circuit that is configured to receive, during a feedback phase, a feedback message, the feedback message indicative of a change to be made to data-to-PAM-symbol mapping schemes, wherein the feedback message includes receiver-side noise statistics; and
a processor that controls operations of the optical communication apparatus to:
decide, based on the receiver-side noise statistics, a current PAM symbol mapping scheme, wherein the current PAM symbol mapping scheme is selected to have symbol spacing proportional to noise distribution measured at each PAM symbol level, and
transmit data during a data transmission phase using the current PAM symbol mapping scheme based on the feedback message, wherein at least some symbols of the current PAM symbol mapping scheme are unequally spaced with respect to each other.

17. The apparatus of claim 16, wherein the feedback message identifies one of the set of modulation schemes suitable for data transmission during the data transmission phase.

18. The apparatus of claim 16, wherein the PAM signals include 4-PAM signals.

19. An apparatus, comprising:
a receiver circuit that is configured to receive, during a training phase, one or more transmissions of pulse amplitude modulation (PAM) signals wherein the PAM signals are modulated using one or more data-to-PAM-symbol mapping schemes, wherein the one or more data-to-PAM-symbol mapping schemes comprise a set of modulation schemes in which PAM symbols are unequally spaced;
a transmitter circuit that is configured to transmit, during a feedback phase, a feedback message, the feedback message indicative of a change to be made to data-to-PAM-symbol mapping schemes, wherein the feedback message includes receiver-side noise statistics; and
a processor configured to:
decide, based on the receiver-side noise statistics, a current PAM symbol mapping scheme wherein the current PAM symbol mapping scheme is selected to have symbol spacing proportional to noise distribution measured at each PAM symbol level, and
implement a data reception phase in which data is received using the current PAM symbol mapping scheme based on the feedback message, wherein at least some symbols of the current PAM symbol mapping scheme are unequally spaced with respect to each other.

20. The apparatus of claim 19, wherein the feedback message identifies one of the set of modulation schemes suitable for data transmission during a data transmission phase.

21. The apparatus of claim 19, wherein the receiver includes an avalanche photo-detector, a PIN photo-detector, or a combination of a pre-amplifier and a photo-detector to receive the one or more transmissions of pulse amplitude modulation (PAM) signal or to receive data.

22. The apparatus of claim 19, wherein the PAM signals include 4-PAM signals.

23. An apparatus, comprising:
a receiver circuit that is configured to receive, during a training phase, one or more transmissions of pulse amplitude modulation (PAM) signals wherein the PAM signals are modulated using one or more data-to-PAM-symbol mapping schemes, wherein the one or more data-to-PAM-symbol mapping schemes comprise a set of modulation schemes in which PAM symbols are unequally spaced, wherein a same maximum level and a same minimum amplitude level are used in each data-to-PAM-symbol mapping scheme;
a transmitter circuit that is configured to transmit, during a feedback phase, a feedback message, the feedback message indicative of a change to be made to data-to-PAM-symbol mapping schemes, wherein the feedback message includes receiver-side noise statistics; and
a processor configured to:
decide, based on the receiver-side noise statistics, a current PAM symbol mapping scheme wherein the current PAM symbol mapping scheme is selected to have symbol spacing proportional to noise distribution measured at each PAM symbol level, and
implement a data reception phase in which data is received using the current PAM symbol mapping scheme based on the feedback message, wherein at least some symbols of the current PAM symbol mapping scheme are unequally spaced with respect to each other.

24. The apparatus of claim 23, wherein the feedback message identifies one of the set of modulation schemes suitable for data transmission during a data transmission phase.

25. The apparatus of claim 23, wherein the receiver includes an avalanche photo-detector, a PIN photo-detector, or a combination of a pre-amplifier and a photo-detector to receive the one or more transmissions of pulse amplitude modulation (PAM) signal or to receive data.

26. The apparatus of claim 23, wherein the PAM signals include 4-PAM signals.

* * * * *

UNITED STATES PATENT AND TRADEMARK OFFICE
CERTIFICATE OF CORRECTION

PATENT NO. : 10,212,010 B2
APPLICATION NO. : 15/649433
DATED : February 19, 2019
INVENTOR(S) : Junwen Zhang et al.

Page 1 of 1

It is certified that error appears in the above-identified patent and that said Letters Patent is hereby corrected as shown below:

In the Specification

In Column 7, Line 44, delete "$d'_{A12}/d'_{A23}=(\sigma_{A1}+\sigma_{A2})/(\sigma_{A2}+\sigma_{A3});$" and insert -- $d'_{A23}/d'_{A34}=(\sigma_{A2}+\sigma_{A3})/(\sigma_{A3}+\sigma_{A4});$ --, therefor.

Signed and Sealed this
Third Day of November, 2020

Andrei Iancu
*Director of the United States Patent and Trademark Office*